United States Patent
Iriguchi

(10) Patent No.: US 6,690,048 B2
(45) Date of Patent: Feb. 10, 2004

(54) SEMICONDUCTOR DEVICE, MANUFACTURING METHOD THEREOF, AND ELECTRONIC APPARATUS

(75) Inventor: Chiharu Iriguchi, Suwa (JP)

(73) Assignee: Seiko Epson Corporation (JP)

( * ) Notice: Subject to any disclaimer, the term of this patent is extended or adjusted under 35 U.S.C. 154(b) by 140 days.

(21) Appl. No.: 10/003,733

(22) Filed: Nov. 15, 2001

(65) Prior Publication Data
US 2002/0109165 A1 Aug. 15, 2002

(30) Foreign Application Priority Data
Nov. 15, 2000 (JP) ........................ 2000-348501

(51) Int. Cl.⁷ .................. H01L 27/148; H01L 29/768; H01L 31/062; H01L 31/113; H01L 21/00
(52) U.S. Cl. .................. 257/291; 257/290; 257/222; 257/292; 438/48
(58) Field of Search ................ 257/292, 290, 257/291, 222; 438/48

(56) References Cited

U.S. PATENT DOCUMENTS

| 6,310,366 B1 | * | 10/2001 | Rhodes et al. | 257/185 |
| 6,326,652 B1 | * | 12/2001 | Rhodes | 257/231 |
| 2002/0027239 A1 | * | 3/2002 | Ohkubo | 257/292 |
| 2002/0036300 A1 | * | 3/2002 | Pain et al. | 257/184 |
| 2002/0081766 A1 | * | 6/2002 | Iriguchi | 438/69 |

* cited by examiner

Primary Examiner—Nathan J. Flynn
Assistant Examiner—Victor A. Mandala, Jr.
(74) Attorney, Agent, or Firm—Harness, Dickey & Pierce, P.L.C.

(57) ABSTRACT

A semiconductor device, a manufacturing method, and an electronic apparatus are provided. The semiconductor device comprises elements, each having a photogate for converting light into an electric charge integrated with a MOS transistor for transferring the electric charge, formed in a substrate formed by depositing a semiconductive layer on an insulating layer.

13 Claims, 6 Drawing Sheets

[FIG. 1]
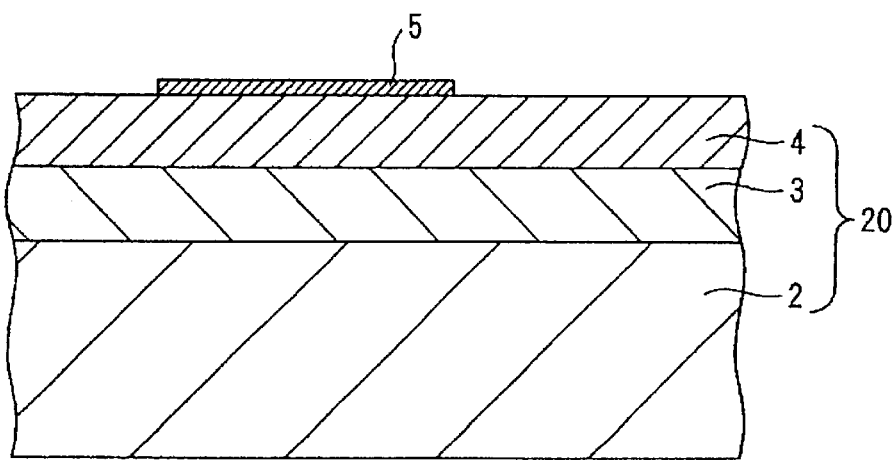
[FIG. 2]
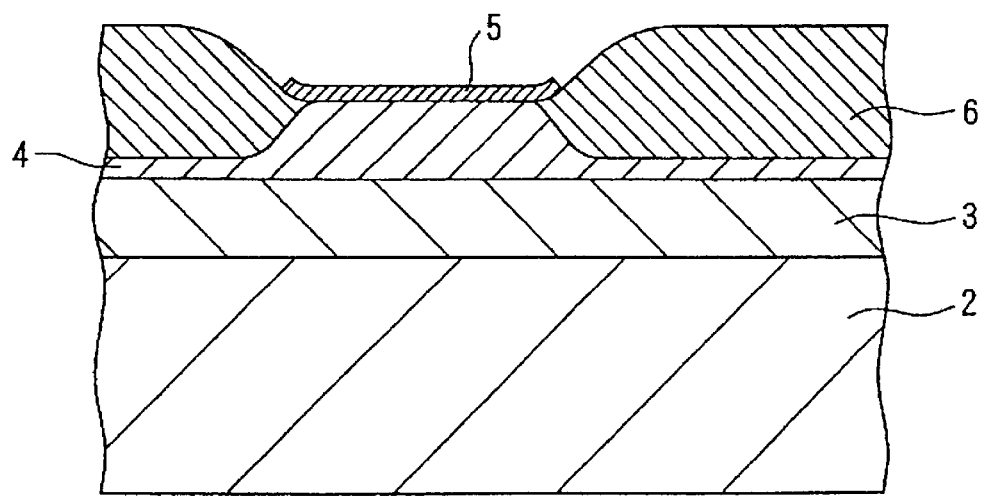

[FIG. 3]
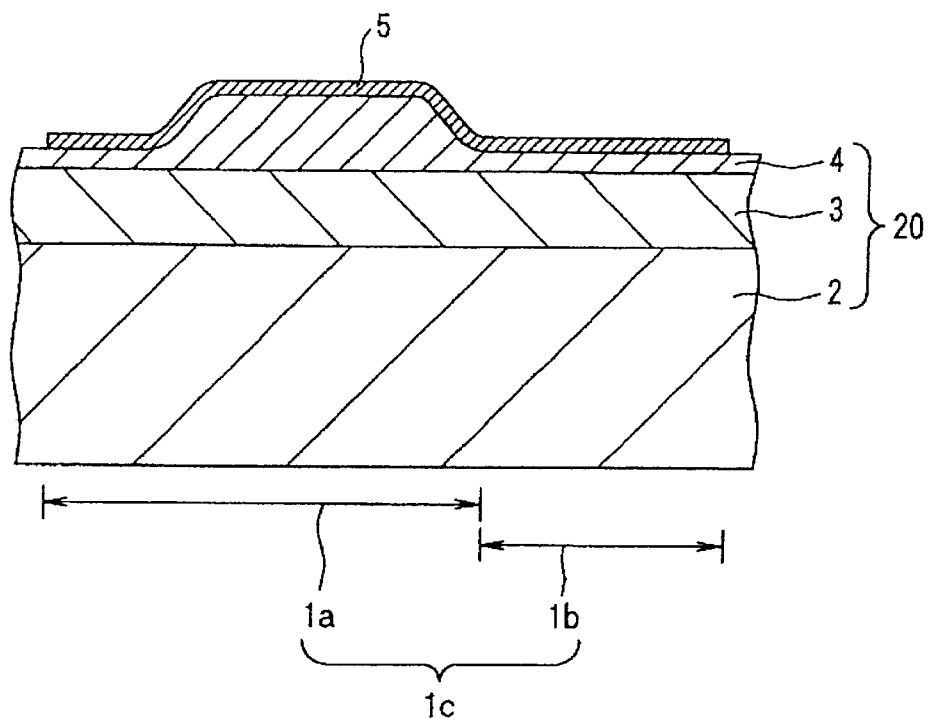

[FIG. 4]
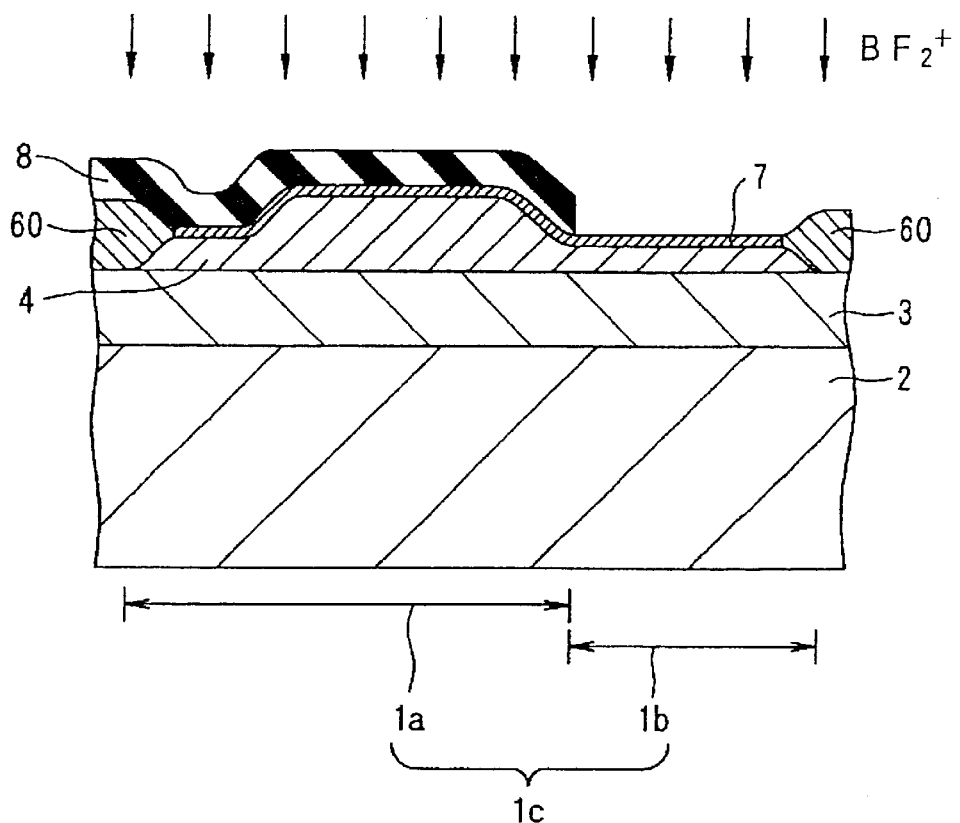

[FIG. 5]
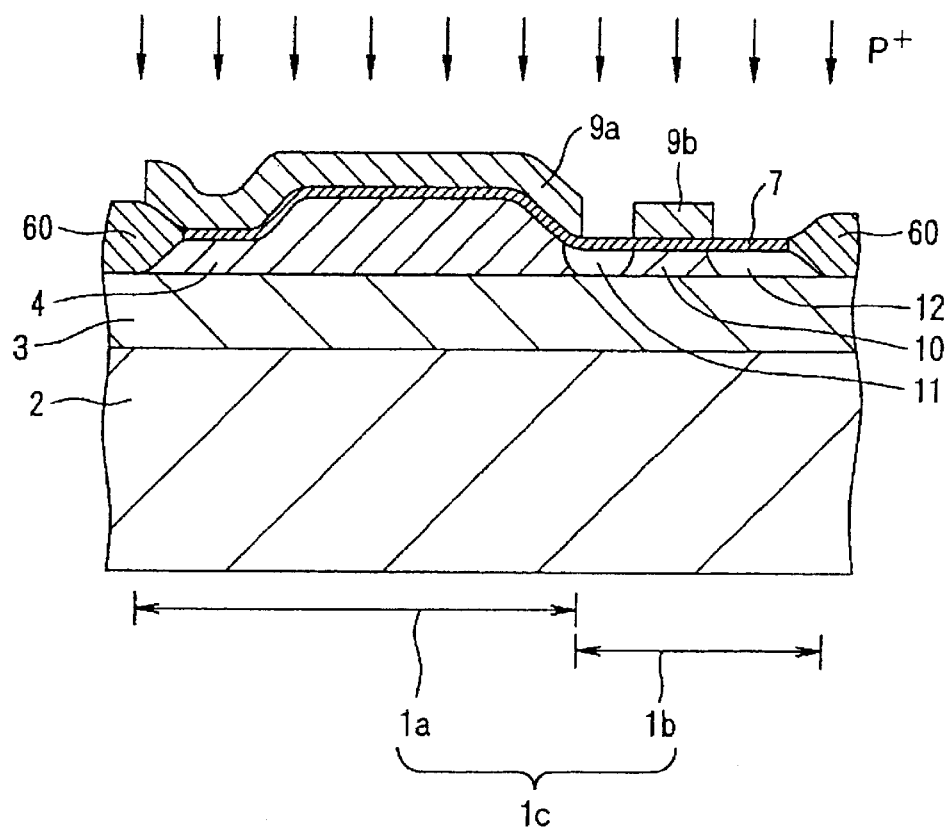

[FIG. 6]
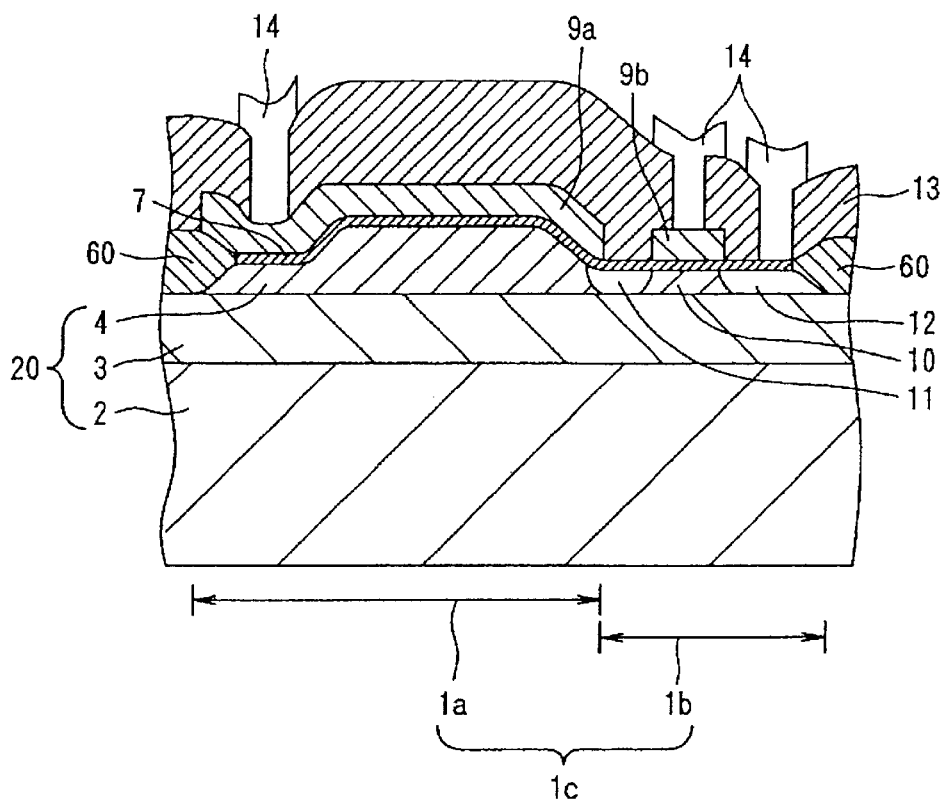

[FIG. 7]
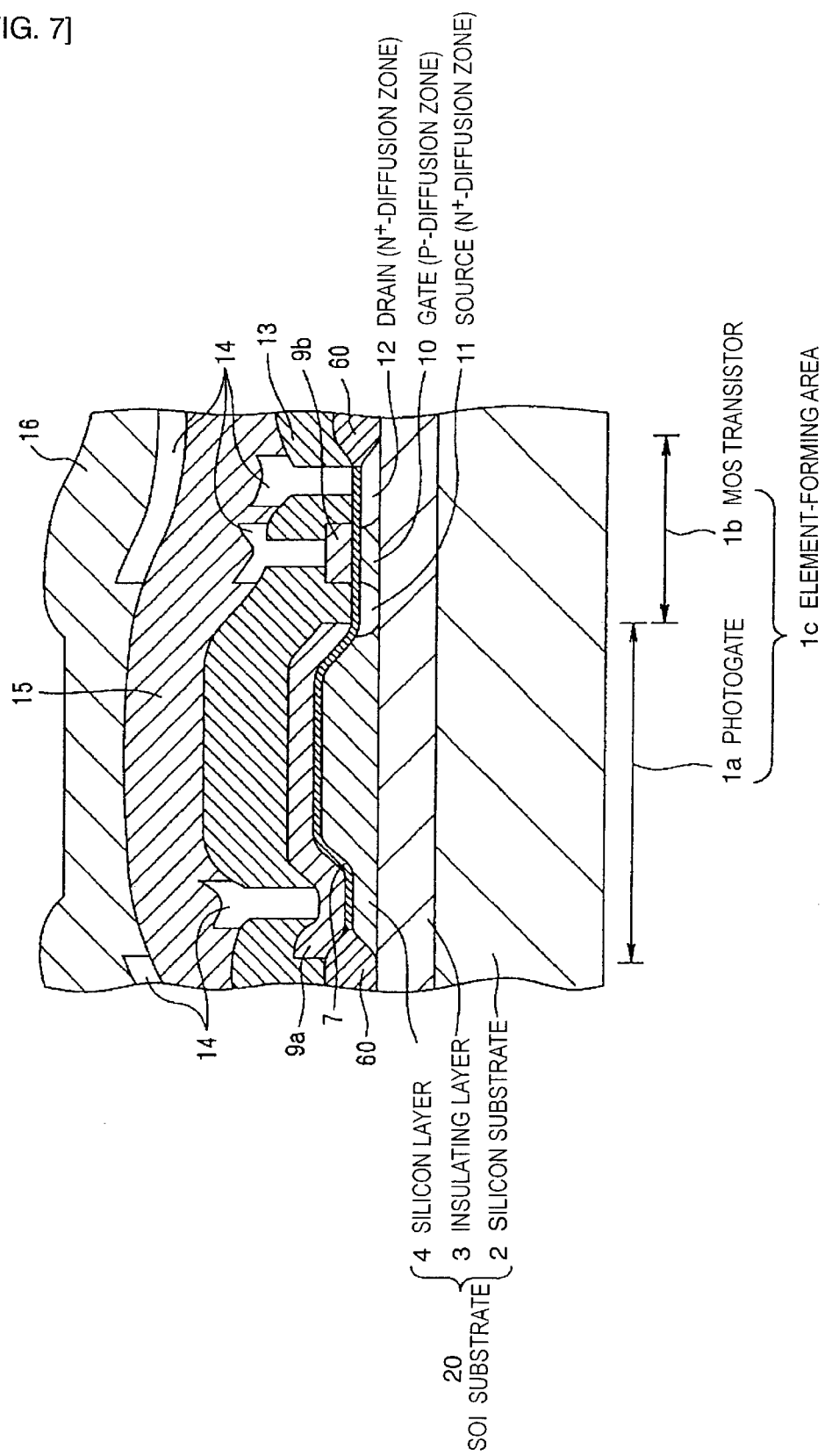

SEMICONDUCTOR DEVICE, MANUFACTURING METHOD THEREOF, AND ELECTRONIC APPARATUS

TECHNICAL FIELD

The present invention relates to semiconductor devices and methods of manufacturing the same. In particular, the present invention relates to a semiconductor device comprising elements, each having a photogate for converting light into an electric charge integrated with a transistor for transferring the electric charge. The elements are formed in a semiconductive layer which is deposited on an insulating layer to form a substrate, such as an SOI substrate, which is formed by depositing a silicon layer on an insulating layer. The present invention also relates to a method of manufacturing the semiconductor device and electronic apparatuses.

BACKGROUND ART

Elements, each having a structure in which a photogate and a MOS transistor are integrated with each other, have been recently used as a semiconductor device for transferring light as electrical signals. These elements are integrated on a bulk silicon substrate to form a semiconductor device in which the photogate converts absorbed light into an electric charge and in which the MOS transistor transfers the converted electric charge as an electrical signal. In this instance, in order to separate the elements, p-n junctions are formed in the silicon substrate and reverse bias voltage is applied to the p-n junctions to prevent current from flowing between the n-type areas.

SUMMARY OF THE INVENTION

In the case of an integrated circuit (IC) or a large-scale integration (LSI) circuit, transistors are densely integrated to highly integrate semiconductor elements; however, the elements directly formed in the bulk silicon substrate allow considerable junction leakage current to occur between a silicon layer and a source connected to the output circuit or between the silicon layer and a drain. The leakage current acts as dark current which causes noise, thereby lowering the S/N ratio and the dynamic range. Also, the elements directly formed in the bulk silicon substrate are likely to allow high-energy incident light to deeply penetrate the silicon layer, thereby causing an electron-hole pair. If this electric charge intrudes into the photogate adjoining thereto, no accurate correlation between the incident light and the electrical signal is exhibited.

The inventors have considered that a semiconductor device comprising elements formed in a semiconductive layer which is deposited on an insulating layer to form a substrate, such as an SOI substrate, which is formed by depositing an insulating layer and a silicon layer on a bulk silicon substrate in that order, would lead to a solution to those problems.

Specifically, it is expected that forming elements, each having the photogate integrated with the MOS transistor, allows the considerable leakage current to be lowered and prevents the electric charge caused by the high-energy incident light from intruding into the photogate, in the SOI substrate or the like.

Accordingly, it is an object of the present invention to provide a semiconductor device comprising elements, each having a photogate integrated with a MOS transistor, in a SIO substrate or the like, a method of manufacturing the same and electronic apparatuses.

To this end, a first semiconductor device of the present invention provides a semiconductor device comprising elements, each having a photogate for converting light into an electric charge integrated with a MOS transistor for transferring the electric charge. The elements are formed in a semiconductive layer which is deposited on an insulating layer to form a substrate. The thickness of the semiconductive layer forming the photogate is larger than that of the semiconductive layer forming the MOS transistor.

By forming the elements, each having a photogate integrated with a MOS transistor, in a semiconductive layer which is deposited on an insulating layer to form a substrate, such as an SOI, junction leakage current flowing between the source or the drain of the MOS transistor and the semiconductive layer is reduced, and consequently the S/N ratio and the dynamic range can be improved.

Also, by forming the semiconductor device in a semiconductive layer which is deposited on an insulating layer to form a substrate, electric charge generated by light is prevented from deeply penetrating the semiconductive layer, and consequently the electric charge can be efficiently collected.

Furthermore, by forming the semiconductive layer forming the photogate so as to have a thickness larger than that of the semiconductive layer serving as the MOS transistor, the semiconductive layer can have thicknesses suitable for the photogate and the MOS transistor.

Thus, the phototransformation efficiency of the photogate and the switching-speed performance of the MOS transistor are effectively improved.

The semiconductor device of the present invention may be formed by preparing elements in a semiconductive layer which is deposited on an insulating layer to form a substrate. Alternatively, the semiconductor device may be formed by preparing the elements in a semiconductive layer provided on another substrate, by removing the semiconductive layer from the substrate, and by putting the removed semiconductive layer on an insulating layer.

In the semiconductor device described above, the semiconductive layer forming the photogate may be in contact with the source area of the MOS transistor.

By forming the semiconductor device such that the semiconductive layer forming the photogate comes into contact with the source area of the MOS transistor, the electric charge converted by the photogate is quickly transferred to the source area of the MOS transistor, and thus the electric charge can be efficiently transferred.

Furthermore, the substrate of the semiconductor device described above may be an SOI substrate formed by depositing a silicon layer on an insulating layer.

A first manufacturing method of a semiconductor device according to the present invention is a method of forming a semiconductor device comprising elements, each having a photogate for converting light into an electric charge integrated with a MOS transistor for transferring the electric charge. The method comprises a step of preparing an SOI substrate formed by depositing a silicon layer on an insulating layer. A step of oxidizing the silicon layer deposited on the insulating layer is performed. In this step, the silicon layer is provided with an oxidation-resistant pattern thereon so as to cover the area for forming the photogate and to expose the area for forming the MOS transistor. The method also comprises a step of removing the silicon oxide layer formed by the oxidation. Thus, the area for forming the photogate has a silicon layer with a large thickness and the area for forming the MOS transistor has a silicon layer with a small thickness.

The method of manufacturing a semiconductor device includes the step of preparing an SOI substrate formed by depositing a silicon layer on an insulating layer, and the elements, each having a photogate integrated with a MOS transistor. As a result, semiconductor devices capable of effectively avoiding problems caused by forming elements on a bulk silicon substrate can be manufactured.

Also, the method includes steps of oxidizing the silicon layer which is deposited on the insulating layer and on which an oxidation-resistant pattern is provided so as to cover the area for forming the photogate and to expose the area for forming the MOS transistor and of removing the silicon oxide layer formed by the oxidation. Thus, the silicon layer can readily have different thicknesses so that the silicon layer has suitable thicknesses to serve as the photogate and the MOS transistor.

An electronic apparatus of the present invention comprises the semiconductor devices arranged in a matrix.

By arranging the semiconductor devices described above in a matrix, microscopic elements can be integrated on a plane surface, and thus the electronic apparatus can receive two-dimensional optical images.

BRIEF DESCRIPTION OF THE DRAWINGS

FIG. 1 is a fragmentary sectional view showing part of the manufacturing process of a semiconductor device according to an embodiment of the present invention.

FIG. 2 is a fragmentary sectional view showing part of the manufacturing process of a semiconductor device according to an embodiment of the present invention.

FIG. 3 is a fragmentary sectional view showing part of the manufacturing process of a semiconductor device according to an embodiment of the present invention.

FIG. 4 is a fragmentary sectional view showing part of the manufacturing process of a semiconductor device according to an embodiment of the present invention.

FIG. 5 is a fragmentary sectional view showing part of the manufacturing process of a semiconductor device according to an embodiment of the present invention.

FIG. 6 is a fragmentary sectional view showing part of the manufacturing process of a semiconductor device according to an embodiment of the present invention.

FIG. 7 is a fragmentary sectional view showing part of the manufacturing process of a semiconductor device according to an embodiment of the present invention.

DETAILED DESCRIPTION OF THE PREFERRED EMBODIMENTS

An embodiment of the present invention will now be described with reference to drawings. FIGS. 1 to 7 are fragmentary sectional views showing part of the manufacturing process of a semiconductor device according to the embodiment of the present invention.

First, a completed semiconductor device 1 will be briefly described. As shown in FIG. 7, the semiconductor device 1 is formed in an SOI substrate 20 formed by depositing an insulating layer 3 formed of silicon oxide and a thin silicon layer 4 on a thick p-type silicon substrate 2 in that order. The silicon layer 4 can serve as a photogate 1a for converting absorbed light into an electric charge and a MOS transistor 1b for transferring the electric charge. The area of the silicon layer 4 serving as the photogate 1a has a thickness larger than that of the area of the silicon layer 4 serving as the MOS transistor 1b.

The silicon layer 4 is covered with a gate oxide 7. Gate electrodes 9a and 9b are formed of polycrystalline silicon on the gate oxide layer 7 corresponding to the photogate 1a and the gate 10 of the MOS transistor 1b. The gate electrodes 9a and 9b are covered with a first insulating layer 13 formed of silicon oxide. The first insulating layer 13 is provided with contact holes extending to the gate electrodes 9a and 9b of the photogate 1a and the MOS transistor 1b. Aluminum is evaporated in the contact holes to serve as wiring metals 14. A second insulating layer 15 formed of silicon oxide, which is the same material as the first insulating layer 13, overlies the first insulating layer 13. The second insulating layer 15 is provided with additional aluminum wiring metals 14 thereon, and then is covered with a silicon nitride passivation layer 16 for protecting the second insulating layer 15. The area forming the photogate 1a in the silicon layer 4 is in contact with the source 11 of the MOS transistor 1b.

An example of a method of manufacturing the semiconductor device 1 will now be described.

First, as shown in FIG. 1, the thin silicon layer 4 is deposited on the silicon oxide insulating layer 3 formed on the thick p-type silicon substrate 2 to prepare the SOI substrate 20. The SOI substrate may be a commercially available product. Next, an oxidation-resistant silicon nitride layer 5 is deposited on the entire SOI substrate 20. Then, the silicon nitride layer is patterned so as to only cover the area for forming the photogate 1a and to expose the area for forming the MOS transistor 1b, and is oxidized.

As a result, and as shown in FIG. 2, the silicon nitride layer 5 prevents oxygen from diffusing into the silicon layer 4 covered therewith, so that the covered area of the silicon layer 4 is hardly oxidized, whereas the exposed area of the silicon layer 4 is oxidized to form the thick silicon oxide layer 6. Then, the silicon nitride layer 5 and the silicon oxide layer 6 are removed by wet etching, and thus in the silicon layer 4 the area for forming the photogate 1a can have a large thickness and the area for forming the MOS transistor 1b can have a small thickness. For example, the photogate 1a and the MOS transistor 1b may have thicknesses of 1 $\mu$m and 1000 Å, respectively.

Next, as shown in FIG. 3, the SOI substrate is provided with another silicon nitride layer 5 so as to cover both areas for forming the photogate 1a and the MOS transistor 1b, and is oxidized to form a thick LOCOS layer 60 (FIG. 4), which is formed of silicon oxide. Thus, the photogate 1a and the MOS transistor 1b are separated from the other area (not shown in the drawings) to form an element-forming area 1c.

Turning to FIG. 4, the thin gate oxide layer 7 is formed of silicon oxide on the entire element-forming area 1c formed in the step shown in FIG. 3. Then, a resist 8 is patterned by known lithography so as to cover the area for forming the photogate 1a and to expose the area for forming the MOS transistor 1b, and subsequently $BF_2$ ions are implanted to form an n-type area.

In this instance, a p-diffusion zone is formed in the silicon layer 4 in the area for forming the MOS transistor 1b to serve as the gate 10 (FIG. 5).

Next, as shown in FIG. 5, the polycrystalline silicon layer 9 is deposited on the entire thin gate oxide layer 7, which is formed in the step shown in FIG. 4, by a known CVD method. At this point, a gas containing phosphorus is introduced concurrently with the thermal decomposition of $SiH_4$ used in the CVD method to lower the resistance of the gates 1a and 10. Then, the resist (not shown in the drawings) is patterned in the same manner as the step shown in FIG. 4 so as to cover the areas for forming the photogate 1a and the gate 10 of the MOS transistor 1b and to expose the areas for forming the source 11 and the drain 12 of the MOS transistor, and subsequently dry etching is applied.

Then, the polycrystalline silicon layer 9 is formed in the areas corresponding to the photogate 1a and the gate 10 of the MOS transistor 1b to serve as the gate electrodes 9a and 9b of the photogate 1a and the MOS transistor 1b.

After removing the resist, phosphorous ions are implanted to form the n-type area. As a result, while the areas forming the photogate 1a and the gate 10 of the MOS transistor 1b are not infused with the phosphorous ions because the polycrystalline silicon layer 9 serves as a mask, the areas for forming the source 11 and drain 12 of the MOS transistor 1b, on which the polycrystalline silicon layer 9 is not formed, turn to $n^+$-diffusion zones.

When the $n^+$-diffusion zones are subjected to activation lamp annealing, the crystallinity of the SOI substrate 20 which is destroyed by the ion implantation is recovered and phosphorous ions are activated. As a result, free electrons and holes serve as carriers.

Turning to FIG. 6, the first insulating layer 13 formed of silicon oxide is deposited on the gate electrodes 9a and 9b, which are formed in the step shown in FIG. 5. The first insulating layer 13 is provided with the contact holes for wiring the gate electrodes 9a and 9b of the photogate 1a and the MOS transistor 1b. First, a resist (not shown in the drawings) is patterned in the same manner as shown in FIG. 4 so that the areas of the first insulating layer 13 corresponding to the gate electrodes 9a and 9b and to the drain 12 of the MOS transistor 1b, in which the contact holes will be provided, are exposed. Subsequently, dry etching is applied to remove the areas of the first insulating layer 13 corresponding to the gate electrodes 9a and 9b and to the drain 12 of the MOS transistor 1b. After removing the residual resist, aluminum is evaporated in the contact holes to serve as wiring metals 14.

Next, as shown in FIG. 7, the second insulating layer 15 formed of silicon oxide is deposited on the first insulating layer 13 in the same manner as the step shown in FIG. 6. After an aluminum layer for serving as the wiring metals 14 is evaporated on the second insulating layer 15, only the wiring metals 14 are formed by etching. Then, the silicon nitride passivation layer 16 is deposited as a top layer to protect the second insulating layer 15 composed of the silicon oxide. Thus, the semiconductor device 1 comprising elements, each having the photogate 1a integrated with the MOS transistor 1b, are completed.

When the semiconductor device 1 receives light as voltage is applied to the gate electrode 9a of the photogate 1a, the semiconductor device 1 generates an electric charge in the photogate 1a according to the intensity of the light. The electric charge generated in the photogate 1a is transferred from the source 11 of the MOS transistor 1b and is output as an electrical signal from the drain 12 of the MOS transistor 1b by applying voltage to the gate electrode 9b of the MOS transistor 1b.

By forming elements in the SOI substrate 20 formed by depositing the silicon layer 4 on the insulating layer 3, negligible junction leakage current, or dark current, flows in the semiconductor device 1, and consequently the S/N ratio and the dynamic range can be improved to prevent noise. Also, since the elements are closely arranged, high integration of the semiconductor elements can be effectively achieved.

Forming elements in the SOI substrate 20 prevents an electric charge from intruding into the adjoining photogate 1a because even high-energy incident light travels through the silicon layer 4 to be ionized in the insulating layer 3. Thus, the contrast of an incident image and the phototransformation efficiency are improved.

In addition, by forming the silicon layer 4 on the insulating layer 3 so as to have thicknesses suitable for the photogate 1a and the MOS transistor 1b, the photogate 1a can efficiently convert light into an electric charge and the MOS transistor 1b can efficiently output the electric charge as an electrical signal. Thus, the charge-transfer efficiency from the photogate 1a to the MOS transistor 1b is improved.

Furthermore, by forming the silicon layer 4 for forming the photogate 1a so as to be in contact with the source 11 of the MOS transistor 1b, the electric charge converted by the photogate 1a can be efficiently transferred to the MOS transistor 1b.

In this instance, since the contact hole connecting to the photogate 1a is not provided at the top but at an end of the photogate 1a, it can be formed together with the contact holes of the MOS transistor 1b by etching in the same step, thus improving the processing efficiency.

Furthermore, by arranging the elements, each having the photogate 1a integrated with the MOS transistor 1b, in a matrix, microscopic elements can be integrated in a planar manner and two-dimensional optical images can be received. Thus, the image quality of electronic apparatuses such as a copier and a scanner can be improved.

While the silicon layer 4 forming the photogate 1a has a thickness of 1 μm and the silicon layer 4 forming the MOS transistor 1b has a thickness of 1000 Å in the present invention, those thicknesses are not limited as long as the silicon layer 4 can serve as the photogate 1a and the MOS transistor 1b.

The conformations of the insulating layers 3, 13, and 15, the oxidation-resistant layer 5, wiring metals 14, gate electrodes 9, and the passivation layer 16, and others are not limited as long as they are formed of the materials having the same functions as the materials used in the above described embodiment.

In this embodiment, the SOI substrate 20 formed by depositing the silicon layer 4 on the insulating layer 3 is used. Another semiconductor may be deposited on the insulating layer 3 instead of the silicon layer 4. Also, while silicon oxide is used for the insulating layer 3 in the embodiment, alternatively another insulative material such as sapphire may be used for the insulating layer.

Advantages

As described above, by forming the elements, each having the photogate integrated with the MOS transistor, in a semiconductive layer which is deposited on an insulating layer to form a substrate, such as the SOI substrate, considerable junction leakage current, which travels through the elements, can be reduced. Also, since the electric charge generated by light is prevented from deeply penetrating the semiconductive layer, the electric charge can be efficiently collected. Contributing to the high integration of the semiconductor elements, therefore, the high-sensitive, electric-power-saving semiconductor devices can be achieved.

Also, by forming the semiconductive layer for forming the photogate so as to have a thickness larger than that of the semiconductive layer for forming the MOS transistor, the semiconductive layer can have thicknesses suitable to serve as the photogate and the MOS transistor. Thus, high-sensitive, electric-power-saving semiconductor devices comprising the photogate having a high phototransformation efficiency and the MOS transistor having a high switching-speed performance can be achieved.

In particular, by forming the semiconductive layer forming the photogate so as to be in contact with the source area of the MOS transistor, an electric charge can be efficiently transferred, and thus electric-power-saving semiconductor devices having a high switching-speed performance can be achieved.

In addition, by oxidizing the silicon layer which is deposited on the insulating layer and which is provided with the oxidation-resistant layer thereon so as to cover the area for forming the photogate and to expose the area for forming the MOS transistor and by removing the silicon oxide layer formed by the oxidation, the silicon layer can have different optimum thicknesses to form the thick area for forming the photogate and the thin area for forming the MOS transistor, having suitable thicknesses to serve as the photogate and the MOS transistor. Thus, high-sensitive, electric-power-saving semiconductor devices comprising the photogate having a high phototransformation efficiency and the MOS transistor having a high switching-speed performance can be achieved.

Furthermore, by arranging the semiconductor devices described above in a matrix, microscopic elements can be integrated in a plane surface, and thus the electronic apparatus according to the present invention can receive two-dimensional optical images.

Thus, the image quality of electronic apparatuses such as a copier and a scanner can be effectively improved.

What is claimed is:

1. A semiconductor device comprising elements, each having a photogate for converting light into an electric charge integrated with a MOS transistor for transferring the electric charge,
    wherein the elements are formed in a common semiconductive layer which is deposited on a first insulating layer to form a substrate,
    wherein a thickness of a portion of the semiconductive layer forming the photogate is larger than a thickness of a portion of the semiconductive layer forming the MOS transistor.

2. A semiconductor device according to claim 1, wherein the semiconductive layer forming the photogate is in contact with a source area of the MOS transistor.

3. A semiconductor device according to claim 1, wherein the substrate is an SOI substrate formed by depositing a silicon layer on the first insulating layer.

4. A semiconductor device according to claim 1 wherein the first insulating layer includes a silicon oxide.

5. A semiconductor device according to claim 1 wherein a first gate electrode is formed above the portion of the semiconductive layer forming the photogate.

6. A semiconductor device according to claim 1 wherein a second gate electrode is formed above the portion of the semiconductive layer forming the MOS transistor.

7. An electronic apparatus comprising a structure in which the semiconductor devices according to claim 1 are arranged in a matrix.

8. A semiconductor device according to claim 1 further comprising a second insulating layer formed above the semiconductive layer.

9. A semiconductor device according to claim 8 wherein contact holes are formed in the second insulating layer.

10. A semiconductor device according to claim 9 wherein the contact holes contain aluminum for providing conductive communication to the first gate electrode and the second gate electrode.

11. A semiconductor device according to claim 8 comprising a third insulating layer formed above the second insulating layer.

12. A semiconductor device according to claim 11 comprising a protective layer formed above the third insulating layer.

13. A semiconductor device according to claim 12 wherein the protective layer includes a silicon nitride passivation layer.

* * * * *